(12) United States Patent
Fye et al.

(10) Patent No.: US 6,734,663 B2
(45) Date of Patent: May 11, 2004

(54) SOLID-STATE ELECTRICITY METER

(75) Inventors: Jeffery F. Fye, Dubois, PA (US); Mark A. Johnson, Dubois, PA (US)

(73) Assignee: Invensys Metering Systems - North America Inc., Uniontown, PA (US)

(*) Notice: Subject to any disclaimer, the term of this patent is extended or adjusted under 35 U.S.C. 154(b) by 0 days.

(21) Appl. No.: 10/205,489

(22) Filed: Jul. 26, 2002

(65) Prior Publication Data
US 2003/0025493 A1 Feb. 6, 2003

Related U.S. Application Data

(60) Provisional application No. 60/307,855, filed on Jul. 27, 2001.

(51) Int. Cl.[7] .................................................. G10R 7/00
(52) U.S. Cl. .................................................... 324/142
(58) Field of Search ........................ 324/142, 96, 157, 324/158.1; 361/367, 372–373, 415, 730

(56) References Cited

U.S. PATENT DOCUMENTS

| | | | | |
|---|---|---|---|---|
| 4,491,789 A | * | 1/1985 | Benbow ...................... 324/113 |
| 4,783,623 A | * | 11/1988 | Edwards et al. ............. 324/156 |
| 4,881,070 A | * | 11/1989 | Burrowes et al. ...... 340/870.02 |
| 5,034,682 A | * | 7/1991 | Mayo et al. ................. 324/142 |
| 5,057,767 A | * | 10/1991 | Keturakis et al. ............. 324/96 |
| 6,059,605 A | * | 5/2000 | Robinson et al. ........... 439/517 |

* cited by examiner

Primary Examiner—Evan Pert
Assistant Examiner—Tung X. Nguyen
(74) Attorney, Agent, or Firm—Andrus, Sceales, Starke & Sawall, LLP

(57) ABSTRACT

A solid-state electricity meter uses a sensor to measure a current supplied to a load. In one aspect, the electricity meter housing includes a meter base, a register cover, and a meter cover. The meter base includes a plurality of meter cover lock notches disposed about a periphery of the meter base. The register cover includes a plurality of secure ramps disposed on a base portion thereof, each secure ramp having a ramped portion along one side and a land portion. The meter cover includes a plurality of locking tabs corresponding to the meter cover lock notches and further includes a plurality of meter cover locks corresponding to the secure ramps. Upon insertion of the meter cover locking tabs into the meter base lock notches and rotation of the meter cover in a predetermined clockwise or counterclockwise direction, the meter cover locks engage the corresponding secure ramps, thereby biasing the meter cover locking tabs against the backside of the meter base to provide a secure connection.

12 Claims, 13 Drawing Sheets

SOLID-STATE ELECTRICITY METER

CROSS-REFERENCE TO PROVISIONAL APPLICATION

This application claims priority from U.S. Provisional Patent Application Serial No. 60/307,855 filed Jul. 27, 2001, the entire disclosure of which is incorporated herein by reference.

FIELD OF THE INVENTION

The present invention relates to electricity meters, and more particularly to solid-state electricity meters.

BACKGROUND OF INVENTION

Electric energy supplied to consumers is commonly measured using conventional electromechanical meters in accordance to American National Standards Institute (ANSI) Form 2S single-phase meter. These standards cover many aspects of meter design, construction, and testing. For example, the dimensions of the base and location of the meter blades must comply with the set standards.

Electromechanical meters are commonly used. However, these meters are mechanically complex and the manufacturing process thereof is similarly complex. Further, the design of such electromechanical meters are substantially immutable and addition of additional capabilities by means of retrofits are exceedingly difficult.

Accordingly, a need exists for reducing the cost of electric meters including manufacturing cost and/or maintenance cost, for example. Such replacement meter must comply with all applicable ANSI standards. Electricity meters are usually installed outside a building to measure electricity consumption in that location. Like any outdoor fixture, electricity meters are exposed to harsh climate such as direct sun, moisture, wind and large variations in temperature. Specially designed construction is needed to protect the meter internal parts from such undesirable environmental elements.

Additionally, meters may need occasional repair or calibration and test services. Any of these activities often require access to the inside of the meter. Therefore, the construction of the meter must allow opening and securely closing of the meter without much effort and time spent by the operator. The construction of the parts that house sensor boards have to be strong enough to withstand vibration and movements caused by opening and closing the meter. Any excessive displacement of sensor boards may affect calibration of the meter and degrade accuracy and reliability of meter readings.

SUMMARY OF THE INVENTION

The present invention provides advantages by incorporating a solid-state electricity meter in an assembly that is inexpensive to manufacture, maintain, and modify.

One aspect of the invention includes a utility meter for measuring electric power consumption comprising a meter base having a front surface and a back surface. A plurality of supports project from the front surface and define a plurality of slotted through-holes disposed adjacent the supports. Each of the supports bears a plurality of resilient locking members at predetermined locations thereof and resilient locking members configured to engage a circumferential edge of a circuit board bearing at least one electrical device. A circuit board comprising a sensor for measuring a current supplied to a load. A bus bar comprises an upper bus bar portion and a lower bus bar portion, each of the upper bus bar portion and lower bus bar portion comprising two substantially planar blades configured for insertion at least partially through the slotted through-holes. A plurality of resilient bus bar locks are disposed adjacent respective slotted through-holes, the resilient bus bar locks comprising an engaging portion at least partially overlapping the adjacent slotted through-hole. A solid-state energy metering circuitry configured for generating power consumption signals from the sensor output is also provide. The bus bar is configured to retain the sensor between the upper bus bar portion and lower bus bar portion, and the engaging portion of the resilient bus bar lock is configured to be displaced from an initial position to a second position by the blades upon insertion of the blades into the slotted through-holes and to return to the initial position following complete insertion of the blade into the through-hole to engage a top surface of the blades and thereby impede withdrawal of the blades from the slotted through-hole.

Another aspect of the invention provides a utility meter housing comprising a meter base and meter cover. The meter base, having a front surface and a back surface, includes a plurality of meter cover lock notches disposed about a periphery of the meter base and a plurality of secure ramps disposed on the meter base front surface, each secure ramp having a ramped portion along one side and a land portion. A meter cover comprises a plurality of locking tabs corresponding to the plurality of meter base lock notches and a plurality of meter cover locks corresponding to the plurality of secure ramps. Upon insertion of the meter cover locking tabs into the meter base lock notches and rotation of the meter cover in one of a predetermined clockwise or counterclockwise direction, the meter cover locks engage the corresponding secure ramps, thereby biasing the meter cover locking tabs against the backside of the meter base to provide a secure connection.

Still another aspect of the invention includes a utility meter housing comprising a meter base, a register cover, and a meter cover. The meter base comprises a front surface and a back surface and has a plurality of meter cover lock notches disposed about a periphery of the meter base. The register cover comprises a plurality of secure ramps disposed on a base portion thereof, each of the secure ramps having a ramped portion along one side and a land portion. The meter cover comprises a plurality of locking tabs corresponding to the plurality of meter cover lock notches and a plurality of meter cover locks corresponding to the plurality of secure ramps. Upon insertion of the meter cover locking tabs into the meter base lock notches and rotation of the meter cover in a predetermined clockwise or counterclockwise direction, the meter cover locks engage the corresponding secure ramps, thereby biasing the meter cover locking tabs against the backside of the meter base to provide a secure connection.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is depicted by way of example, and not by way of limitation, in the following figures.

DETAILED DESCRIPTION OF THE INVENTION

An electricity meter assembly per the invention comprises a meter base and cover, a register cover, bus bars, a sensor board, a Liquid Crystal Display (LCD) board, a meter hanger and a phantom load link. One of the requirements, by industry standards, is that the dimensions of the base and location of the meter blades, or bayonets, are as specified in FIG. 3 of ANSI C12.10-1997, which is incorporated herein by reference. Other requirements are variously set forth in standards such as, but not limited to, ANSI C12.1-1988, ANSI C12.14-1982, ANSI C12.16-1991, ANSI C12.7-1993, and ANSI C12.13-1991, which are hereby incorporated by reference.

Figure 1:
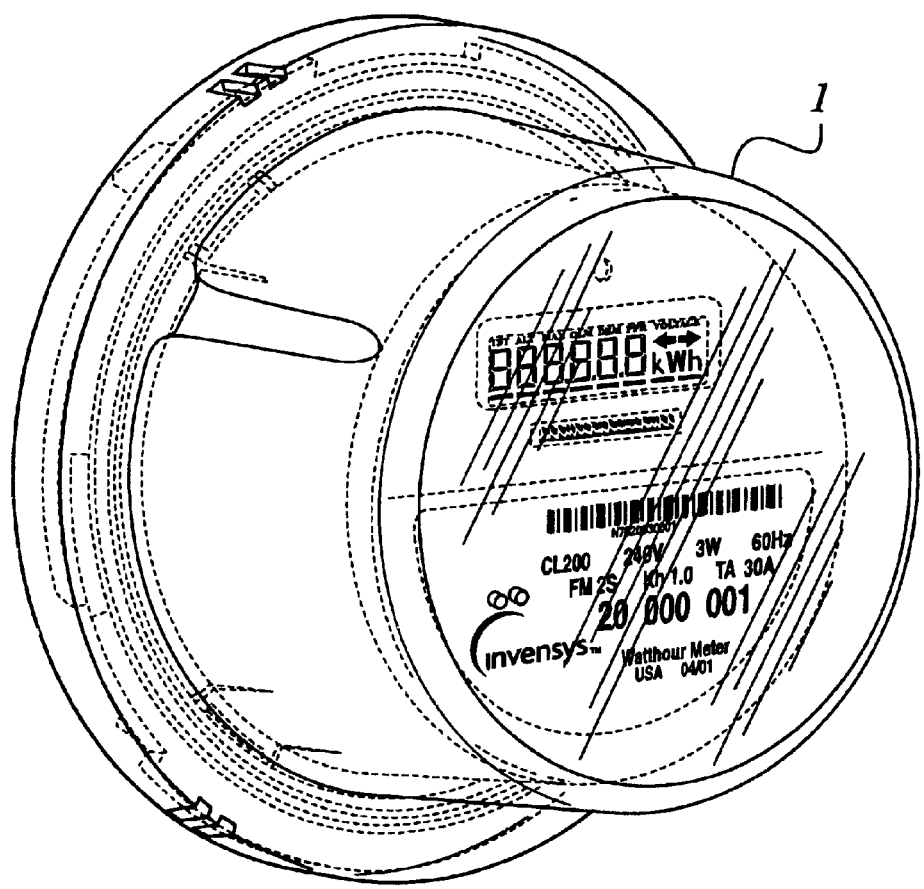
FIG. 1 shows the complete assembly of the electricity meter of the present invention.

Referring to FIG. 1, a complete electricity meter assembly is shown by what would be viewed from the outside of the meter in a typical residential installation. The meter is made up of several parts which will be described with reference to the expanded views of the meter in FIGS. 2 and 3. The meter includes meter base 2, which when connected to register cover 3 and meter cover 1, encloses sensor board 5 as well as its contacts on the upper and lower bus bars 4L and 4U. The upper bus bar 4U and lower bus bar 4L comprise contact tabs 37, also known as meter blades or bayonets.

Upper and lower bus bars 4L and 4U are, in one aspect, made of copper and have a thickness of 2.5 millimeters (2.5 mm) and a width of 5 mm with an inner loop portion approximately having an inner diameter of 9.8 mm and an outer diameter similar to that of the outer diameter of the sense portion 6. Blade portions 37 have, in one aspect, a width of 19.5 mm. These dimensions are by way of example only and may be varied in accord with applicable design requirements or industry standards.

Figure 2:
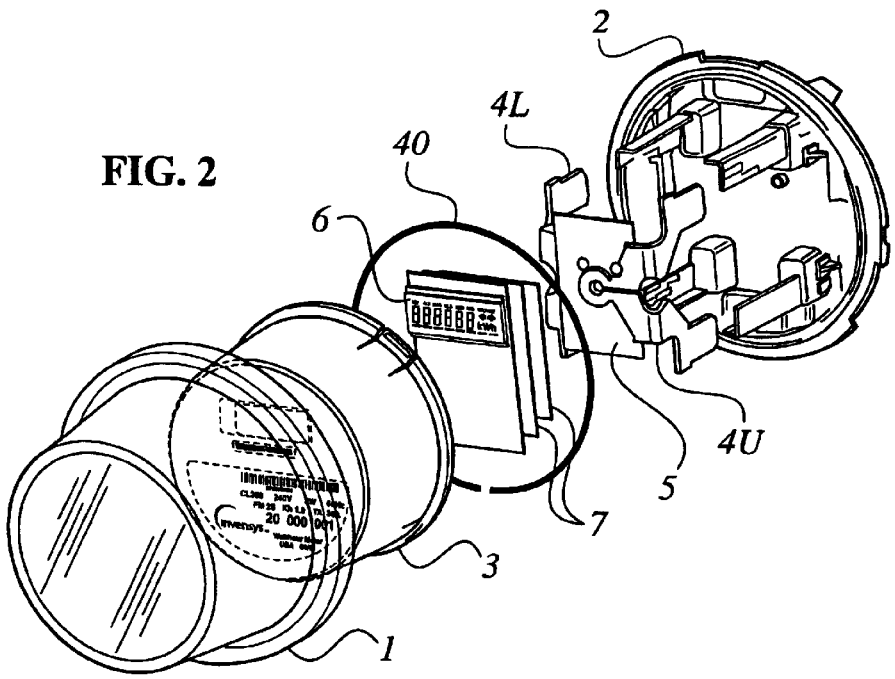
FIG. 2 shows a front expanded view of the electricity meter assembly.
Figure 3:
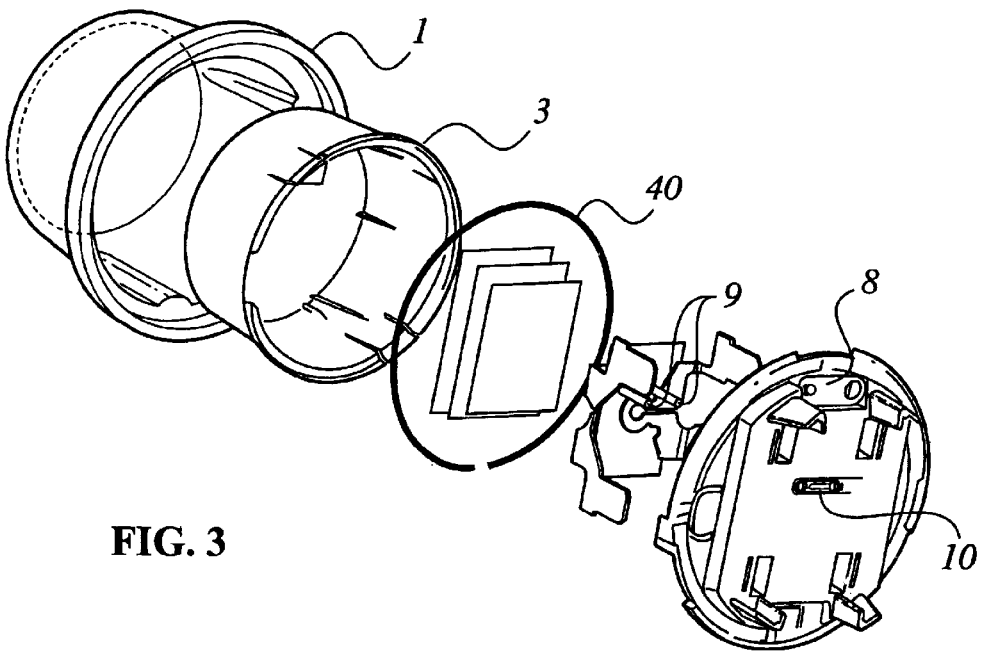
FIG. 3 shows the expanded rear view of the electricity meter assembly.

Optional printed circuit boards (PCBs) 7 may be included inside the meter in addition to the sensor board. Seal 40, which may comprise an o-ring or gasket, insures that the cover and the base are tightly connected in order to protect the meter from environmental elements. Same elements are shown in FIG. 3 is an exploded rear view of FIG. 2, additionally showing phantom load conductors 9 are connected to the sensor board, as well as phantom load link 10 and meter hanger 8 provided at the rear surface of meter base 2.

Since the electricity meter of the present invention is of solid-state design, it requires fewer components than conventional electromechanical meters and, accordingly, provides for economical manufacture, maintenance, and modification. Additionally, current plastic fabrication techniques and integrated molding processes, known to those skilled in the art, can be advantageously utilized to incorporate complicated device geometries inclusive of features such as, but not limited to, snap fittings, openings, windows, and guide members. Use of such fabrication techniques simplifies assembly and lowers cost.

Figure 4A:
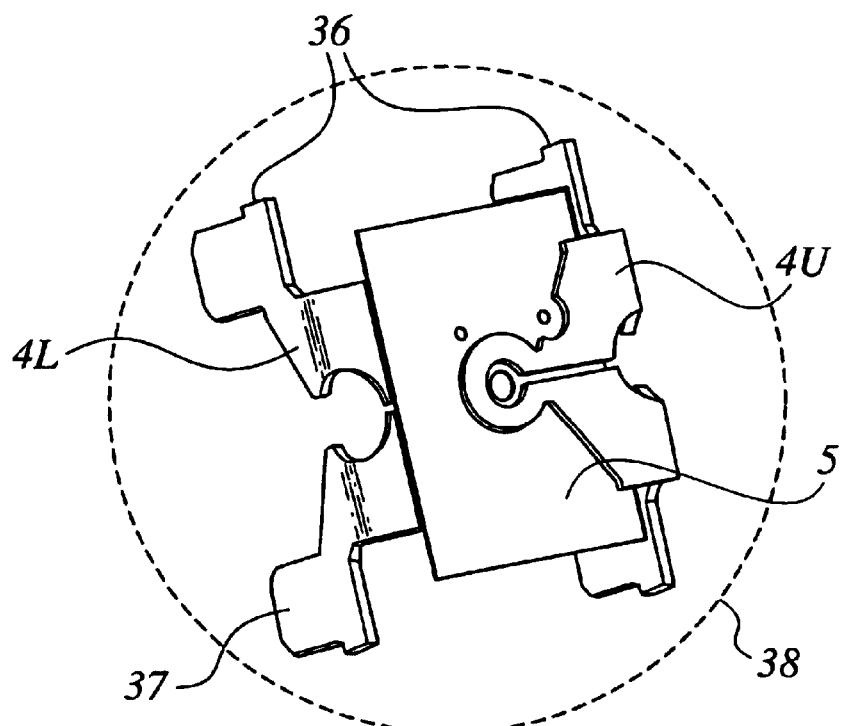
FIGS. 4(a) and 4(b) show front and rear views of the sensor board assembly.
Figure 4B:
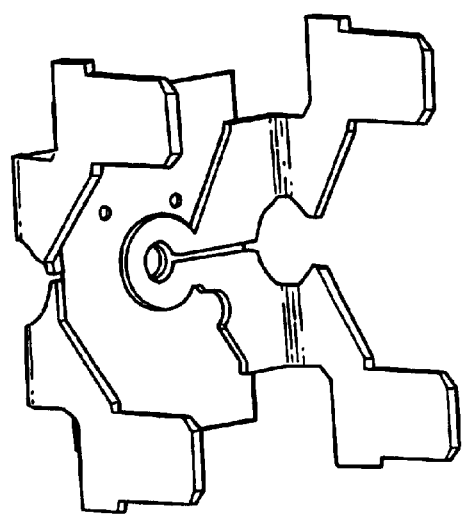

In FIGS. 4a and 4b, the measuring element of the meter, a sensor board assembly 38, is depicted. The sensor board 38, such as the sensor board designed by Sentec Ltd. of Cambridgeshire, GB, and discussed in U.S. Pat. No. 6,414,475 issued to Dames, et al. on Jul. 2, 2002, hereby incorporated by reference, measures a current supplied to a load. This measurement is accomplished by using a sensing coil to detect a magnetic field, which induces an electromotive force in the sensing coil proportional to the current flowing through the bus bar 4. The sensing coil, although not shown in FIGS. 4(a) and 4(b), is disposed about the opening in the center of sensor board 5 and under/over the centrally-disposed substantially round portions of respective upper and lower bus bars 4L, 4U.

In operation, the sensor board sensor (not shown), such as a sensing coil, develops an output signal that is the derivative of the load current waveform (i.e., there is a 90 degree phase shift that is constant with respect to variations in load current, temperature, frequency, and external magnetic fields). The constancy achieved thereby provides a benefit over the influences causing shifts in the accuracy of conventional electromechanical meters and some solid state meters with other types of current sensing, such as current transformers. The derived current signal and the applied voltage are scaled and output to an active energy metering IC configured to generate, for example, power consumption signals from the voltage and current inputs. The current measurement could, for example, be combined with a measurement of the voltage between the bus bar upper 4U and lower 4L portions to derive a measure of the instantaneous power used by a connected load. A display processor coupled to the active energy metering IC receives the energy data from the active energy metering IC and outputs a display signal to a display readout, such as a LCD 6 or LED, as shown in FIG. 2. The meter advantageously stores the energy data outputs in a suitable data storage medium, such as a solid-state memory device, for later access by the utility company, or transmits the data via a communications link such as, but not limited to, an integrated modem, RF transmitter, or electromagnetic energy based communication device, according to a predetermined protocol.

FIGS. 4(a) and 4(b) show bus bar 4, comprising lower bus bar 4L and upper bus bar 4U. Bus bar 4 and sensor board 5 are integrated into an assembly 38, as shown. This is accomplished by, in one aspect of the invention, disposing sensor board 5 between an upper surface of the lower bus bar 4L and a lower surface of the upper bus bar 4U and connecting the two bus bars 4U and 4L to the sensor board by, for example, soldering. In this aspect of the invention, the sensor board 5 contacts, through an interposed insulating material (not shown), substantially all of an upper surface of the lower bus bar 4L and substantially all of a lower surface of the upper bus bar 4U. Alternatively, the bus bars 4 4L, 4U could be configured to contact the sensor board 5 only in the vicinity of the through-hole in the center of the sensor board and the sensing coil disposed about the through-hole. Means of attaching the bus bars 4L, 4U to the sensor board 5 may also include, but are not limited to, welding or use of conductive adhesive materials.

A trace outline of the upper bus bar 4U or lower bus bar 4L may optionally be formed in a respective side of the sensor board 5 to facilitate alignment and connection of the bus bars 4U, 4L to the sensor board. In one aspect of the invention, sensor board 5 has a trace outline of upper bus bar 4U and lower bus bar 4L formed in respective upper and lower surfaces to facilitate alignment of the sensor board with upper and lower bus bars. The surface of the sensor board 5 disposed within the trace outline is preferably treated and prepared for attachment to the bus bar 4 appropriate to the attachment technique (e.g., soldering) in a manner known to those skilled in the art. The trace outline preferably corresponds in shape to the shape of the respectively adjacent bus bar 4U, 4L portion and is sized and toleranced to be slightly larger than such adjacent bus bar 4U, 4L portion to simplify and enhance alignment of the bus bar 4 with sensor board 5. In the above-described configuration, sensor board 5 is securely held by bus bar 4.

Positioning of bus bar 4 is relative to meter base 2 is accomplished, in part, by bottoming stops 36, which are configured to contact the meter base and restrict further movement of the bus bar 4 in a direction toward the meter base upon installation of sensor assembly 38 onto the meter base. Bus bar guides 19 help direct and position assembly 38 into four bus bar slots 18. Bus bar locks 20 are provided to resiliently deflect to permit passage of contact tabs 37 upon insertion of the contact tabs into bus bar slots 18 and to resiliently engage an upper lateral surface 37U of contact tabs 37 after the upper lateral surface 37U is inserted such that the bottoming stops 36 contact the meter base 2. Thus, bus bar 4 contact tabs 37 are securely held between meter base 2 on one side and bus bar locks 20 on the other side.

Figure 5:
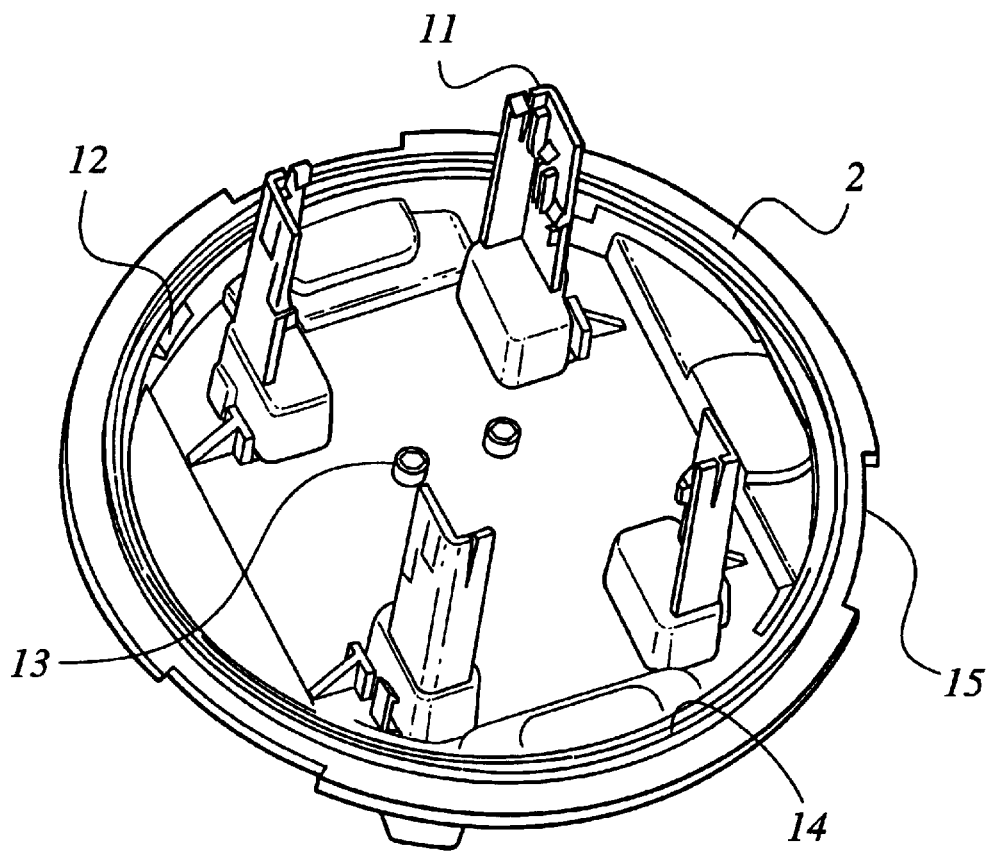
FIG. 5 shows the front view of the electricity meter base.
Figure 6:
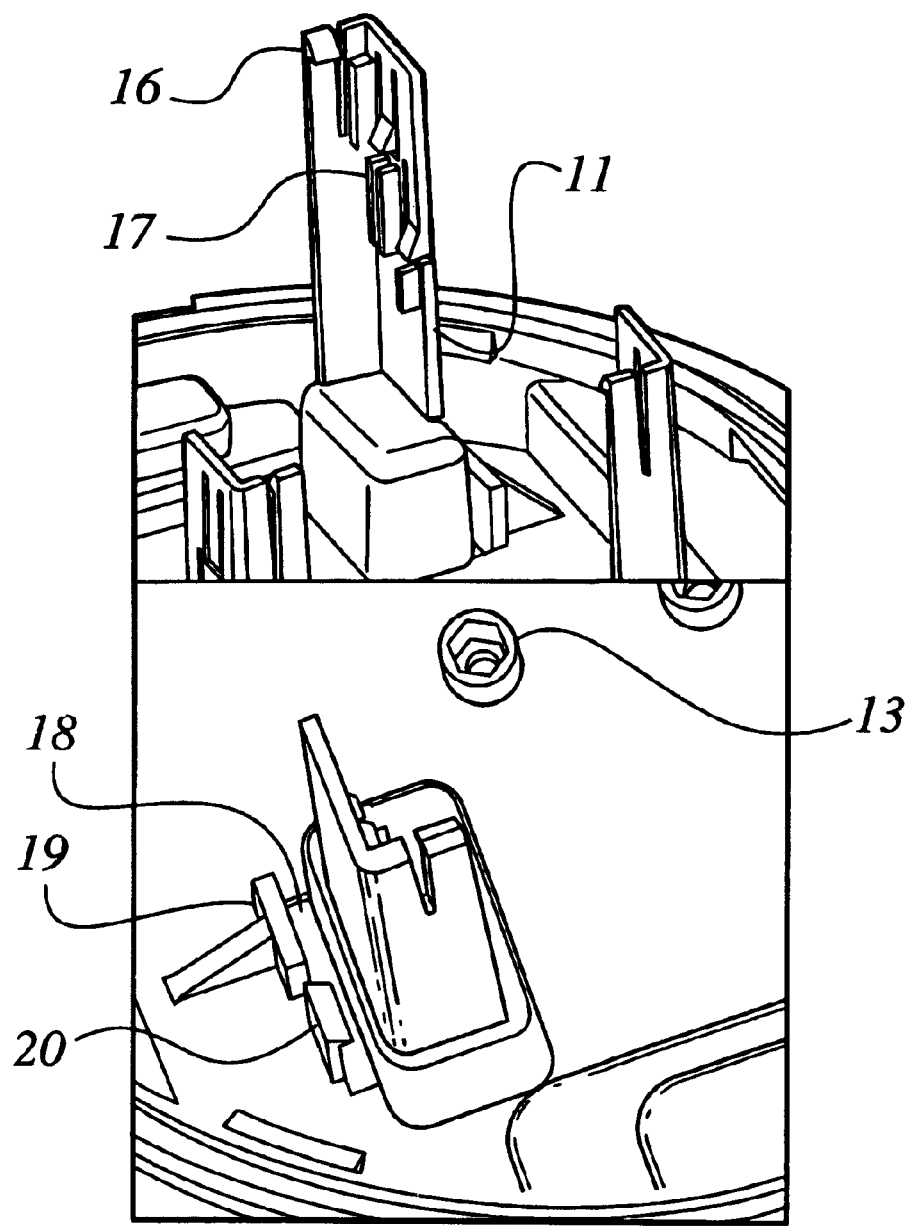
FIG. 6 shows enlarged views of a PCB support and bus bar slot of the electricity meter base.

Additionally, as shown in FIGS. 5 and 6, substrate or printed circuit board (PCB) supports 11 are provided at four places on meter base 2. An alternate number of supports 11 may be provided and could consist of three distributed supports or two opposing supports, for example. These PCB supports 11 comprise a combination of features allowing for positive confinement of both LCD board 6 or similar display board and optional substrates or PCBs 7. Such positive confinement is achieved by a PCB locking means comprising PCB intermediate supports 17, which provide a resting area for a bottom surface of a substrate or PCB, and PCB locks 16, which resiliently and securely engage and hold a top surface of a substrate or a PCB. A plurality of PCB intermediate supports 17 and corresponding PCB locks 16 are provided on each PCB support 11.

Figure 10:
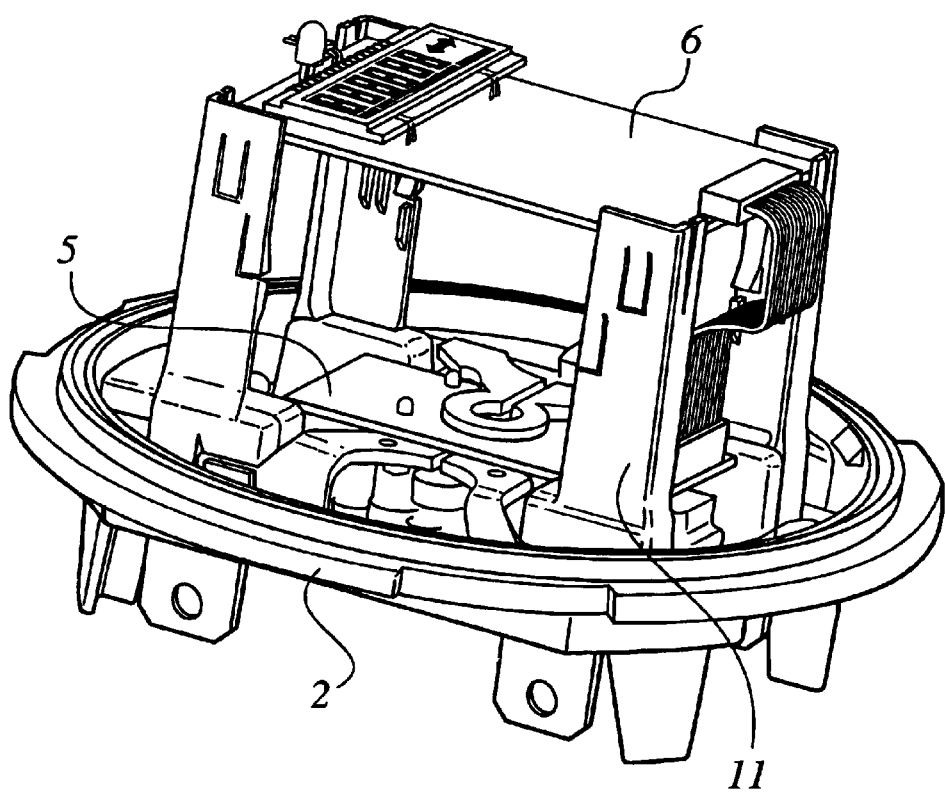
FIG. 10 shows the assembly in FIG. 9 without the optional PCB boards installed.

In one aspect, four PCB locking means are provided on each PCB support 11 to support installation of additional optional substrates or PCBs bearing, for example, modems, radio frequency (RF) transmitters or transceivers, receivers, power supplies, relay inputs or outputs, Ethernet connection and communication devices, extended memory modules, WWV time chips, antennas, and/or electromagnetic-based data transmission devices, as generally known to those skilled in the art. Such optional capability may comprise, for example, communications schemes disclosed in co-pending U.S. patent application "System And Method For Communicating And Control Of Automated Meter Reading" filed on May 6, 2002 by Belski, et al. (number not assigned), incorporated herein by reference. Further, electrical interconnections between PCBs may be achieved by any conventional electrical connection means including, but not limited to, ribbon connectors such as shown in FIG. 10 or press-fit male-female connectors. Additionally, the PCB boards may themselves be configured to be stackable upon one another utilizing on-board mechanical connectors (e.g., snaps and/or spacers) and/or conventional electrical connectors, thereby permitting additional variability in the design of the supports 11.

Accordingly, as shown for example in FIG. 5, meter base 2 provides a stable platform upon which the meter is built. When the meter is placed or taken from a meter socket, the mechanical strength or rigidity of the meter base 2 is sufficient to withstand insertion and extraction forces applied during installation or maintenance. As noted above, meter base 2 and sensor board assembly 38 are configured to capture the PCBs, inclusive of the sensor board 5, and transmit forces on the blades or contact tabs 37, which may rise to about 60 lbs. per blade during installation, away from sensor board 5 to ensure that there are no dimensional changes in sensor board 5. Such dimensional changes could render the sensor board inoperable or cause a permanent change in calibration by, for example, disturbing and/ breaking the solder connection between the sensor board 5 and bus bar 4. Use of commercially available conductive adhesives, noted above, may further serve to improve the robustness of the disclosed design.

Figure 8:
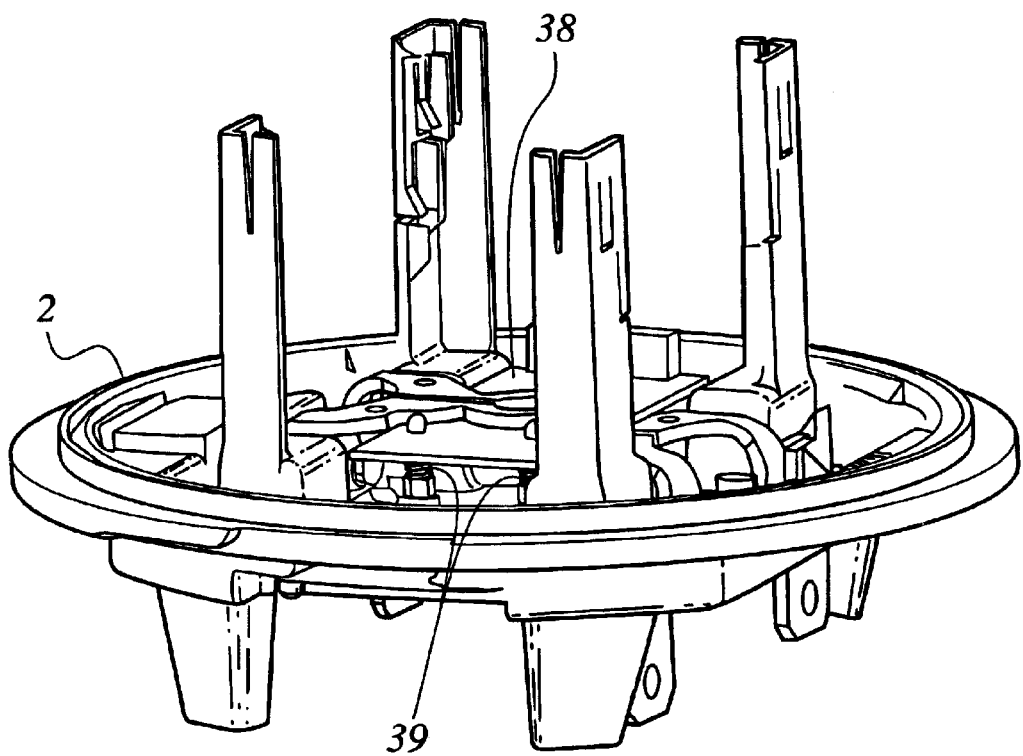
FIG. 8 shows the sensor board assembly in the electricity meter base.
Figure 11:
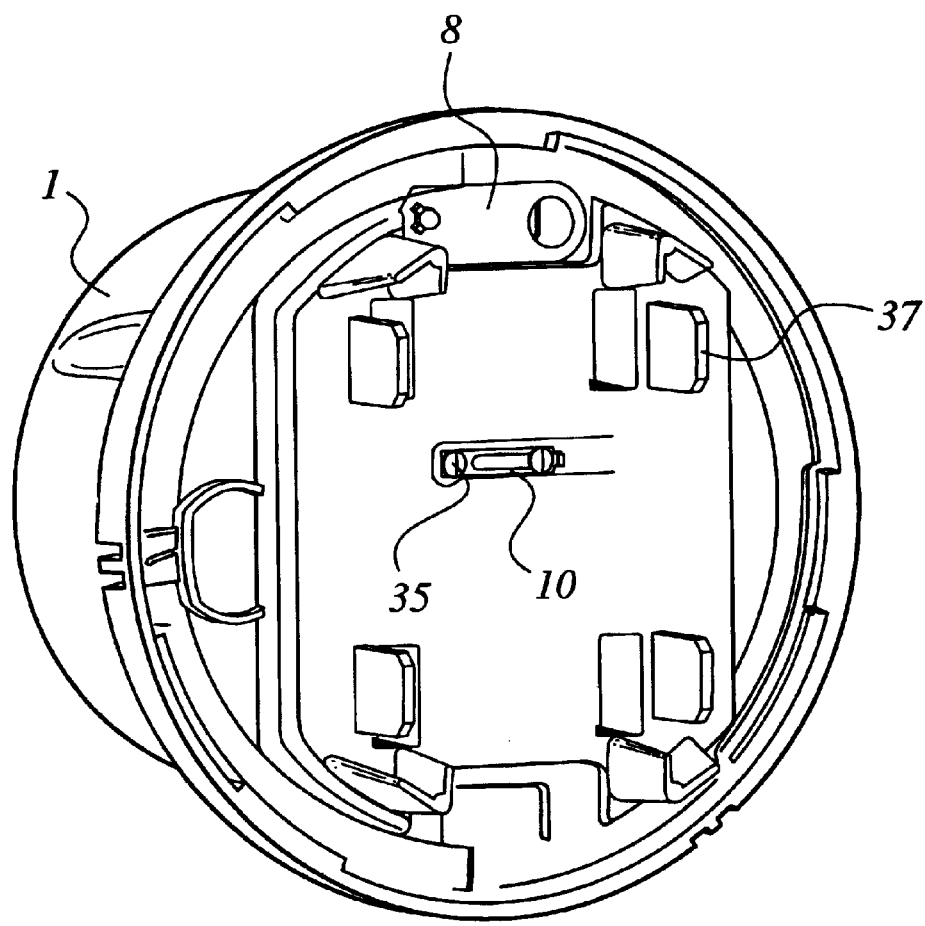
FIG. 11 shows the rear view of the electricity meter assembly.

FIG. 8 shows sensor board assembly 38 secured in meter base 2. Base 2 includes a phantom load circuit for testing and calibration purposes. This phantom load circuit comprises, in one aspect of the invention, two phantom load conductor sockets 13, two load conductors 9, two phantom load springs 39, two screws 35, and link 10, as shown in FIGS. 3, 5, 8, and 11. Phantom load conductors 9 comprise, in one aspect, a hexagonal (hex-) or polygonal shaped portion on one end and a stud portion on an opposite end, as shown in FIG. 8. Alternatively, the phantom load conductors 9 may be of any suitable configuration able to establish electrical contact between a phantom load circuit trace on the sensor board 5, on one side, and the phantom load link 10, on another side. Advantageously, the phantom load conductors 9 employ an anti-rotation feature such as, but not limited to, a polygonal shape on at least one end portion thereof matingly insertable into a phantom load conductor socket defining a similar polygon. In the above configuration, the stud portion protrudes through spring 39 and sensor board 5 as shown, for example, in FIG. 8. The phantom load springs 39 are compressed between appropriate phantom load circuit traces on a bottom surface of sensor board 5, on one side, and a hex-portion or polygonal portion of phantom load conductor 9, on the other side, as illustrated in FIG. 8. The phantom load link 10 is attached using screws 35, as shown in FIG. 11.

In accord with the above-described configurations, the phantom load circuit can be simply engaged or disengaged from the back of the meter base. Further, the phantom load circuit can be simply assembled and disassembled using by virtue of the mating engagement between the phantom load conductor, phantom load socket, and sensor board configurations, particularly in conjunction with the aforementioned anti-rotation features.

Figure 7:
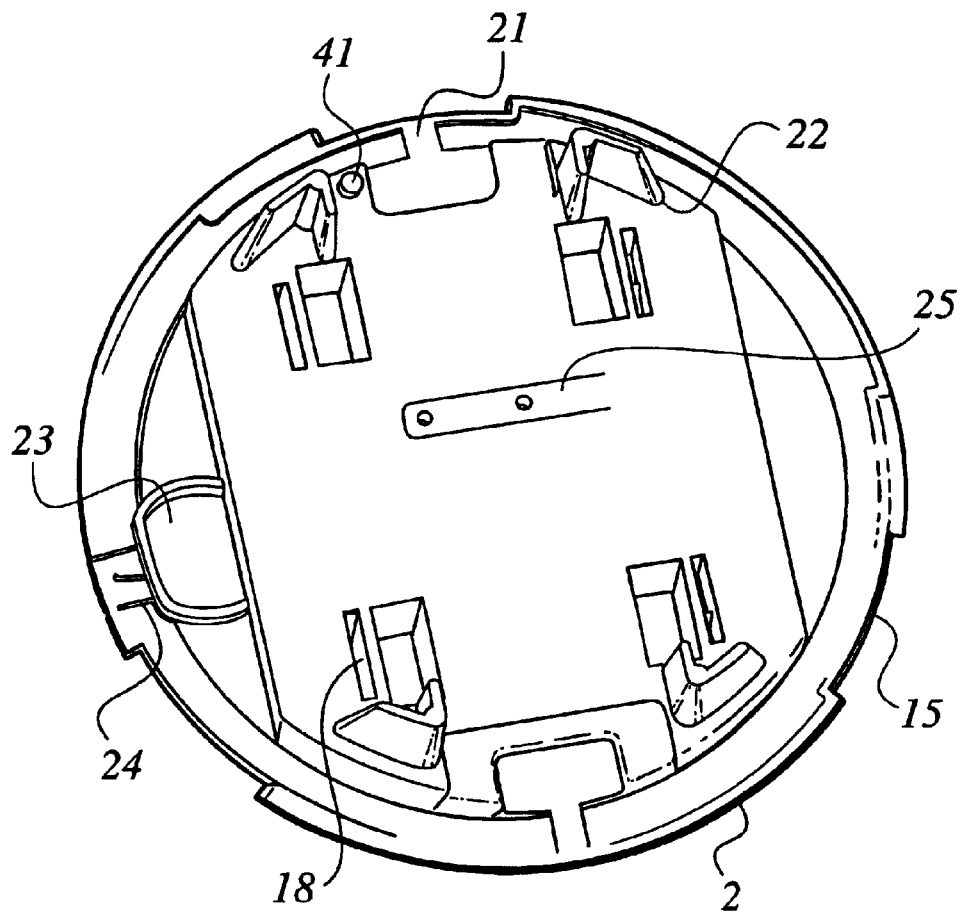
FIG. 7 shows the rear view of the electricity meter Base.

Molded hex sockets 13 have through-holes, shown in FIG. 7, to the back of meter base 2 where phantom load link 10 is affixed with an attachment means such as but not limited to screws 35. Phantom load conductors 9 are axially retained in hex shaped sockets 13 when two phantom load link screws 35 are secured.

Turning to FIG. 11, phantom load link 10 is a metallic or conductive key which, when disengaged, will enable normal operation of the meter. To engage the phantom load link and correspondingly disable the meter, an operator loosens two screws 35 approximately two to four turns, slides link 10 fully to the left, and re-tightens screws 35. This sequence of operations is reversed to disengage the phantom load link after testing and enable the meter for service. Link 10 is engaged only when the meter is to be tested by the utility company or the meter manufacturer.

FIG. 7 shows a rear view of meter base 2. Four support legs 22 are provided for use as stops during installation of the meter in a typical meter box. A T-bar seal pocket 23 and slot 24 are molded into the back of the meter base. A T-bar seal (not shown) is installed through the T-bar slot 24 and is tied or wrapped through the T-bar access hole feature 33, shown on the meter cover in FIG. 14. The T-bar, a device that is used to show if the meter has been tampered with, is made of a material that breaks if attempt is made to unbend it while the meter cover is detached from the base. Each time an operator from the utility provider removes the cover from the base, broken T-bars are replaced and sealed. Test board activator protrusions 21, molded into two places, engage with pin switches on the manufacturer's test equipment to verify proper meter seating and installation for tests. Meter hanger 8 is affixed to the meter base by press fitting over meter hanger head 41 feature molded into the meter base. This feature may be used during meter assembly and customer storage.

Other features present of meter base 2 include register cover lock tab 12, cover seal groove 14 and meter cover lock notch 15 as shown, for example, in FIG. 5. All of these features relate to fastening of the cover 1 to the meter base 2 to provide a secure meter enclosure. An o-ring or other sealing means (e.g., meter cover seal 40) may optionally be provided in or adjacent cover seal groove 14.

Figure 9:
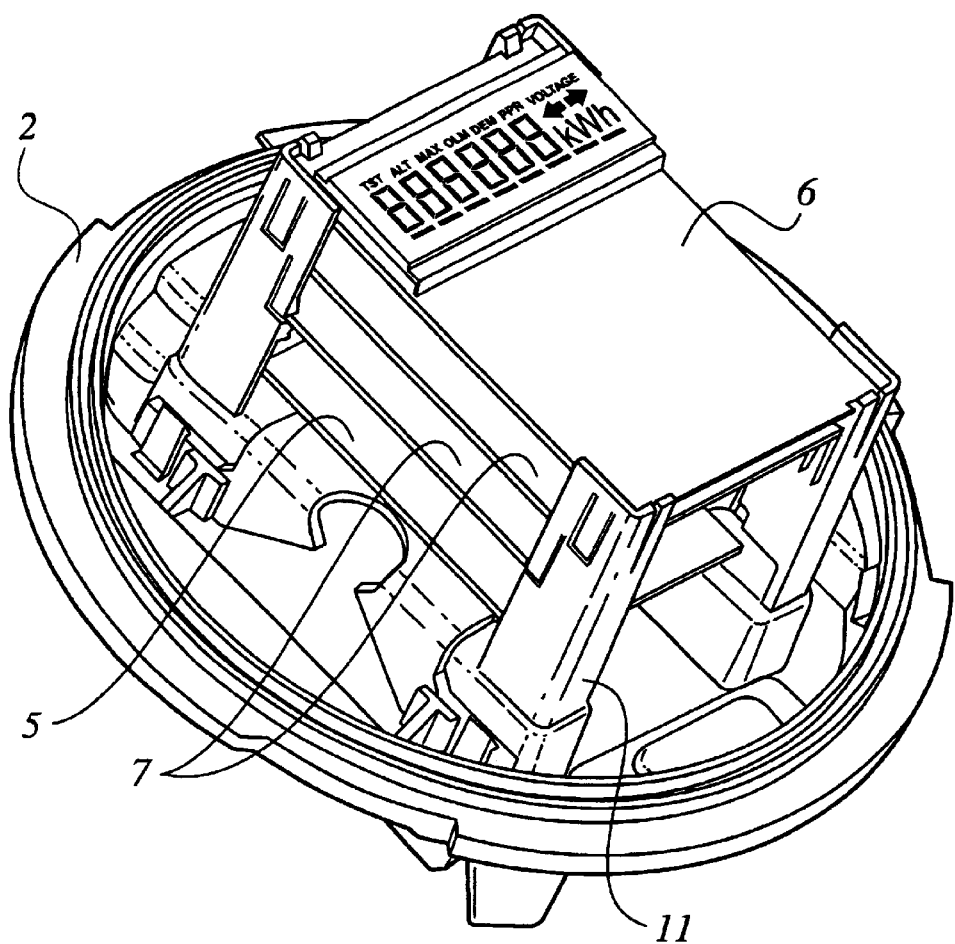
FIG. 9 shows optional PCB and LCD boards assembled in the electricity meter base.

FIGS. 9 and 10 respectively show sensor board 5 assembly 38 and LCD board 6 with and without optional PCBs 7 as they are housed within four PCB supports 11 on the meter base 2. As shown in FIG. 9, the optional PCBs are positioned between the sensor and the LCD boards in between corresponding PCB intermediate supports 17 and PCB locks 16, illustrated in FIG. 6.

Figure 12:
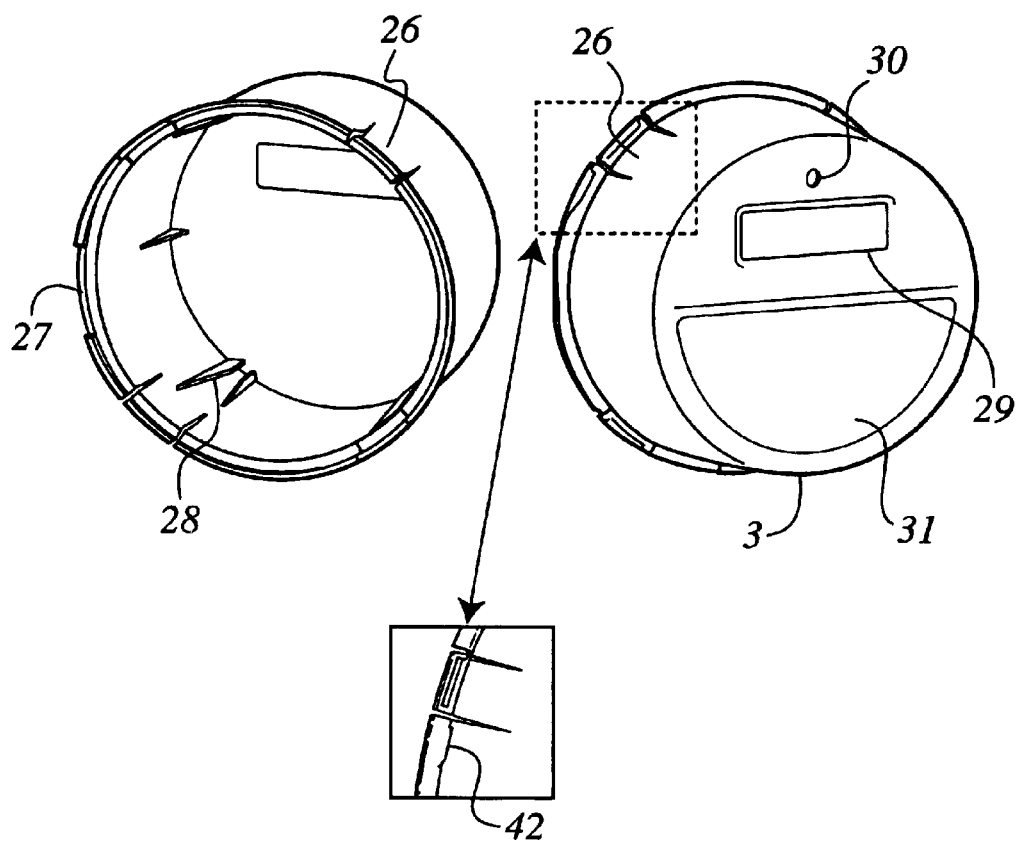
FIG. 12 shows front and rear views of the register cover.
Figure 13:
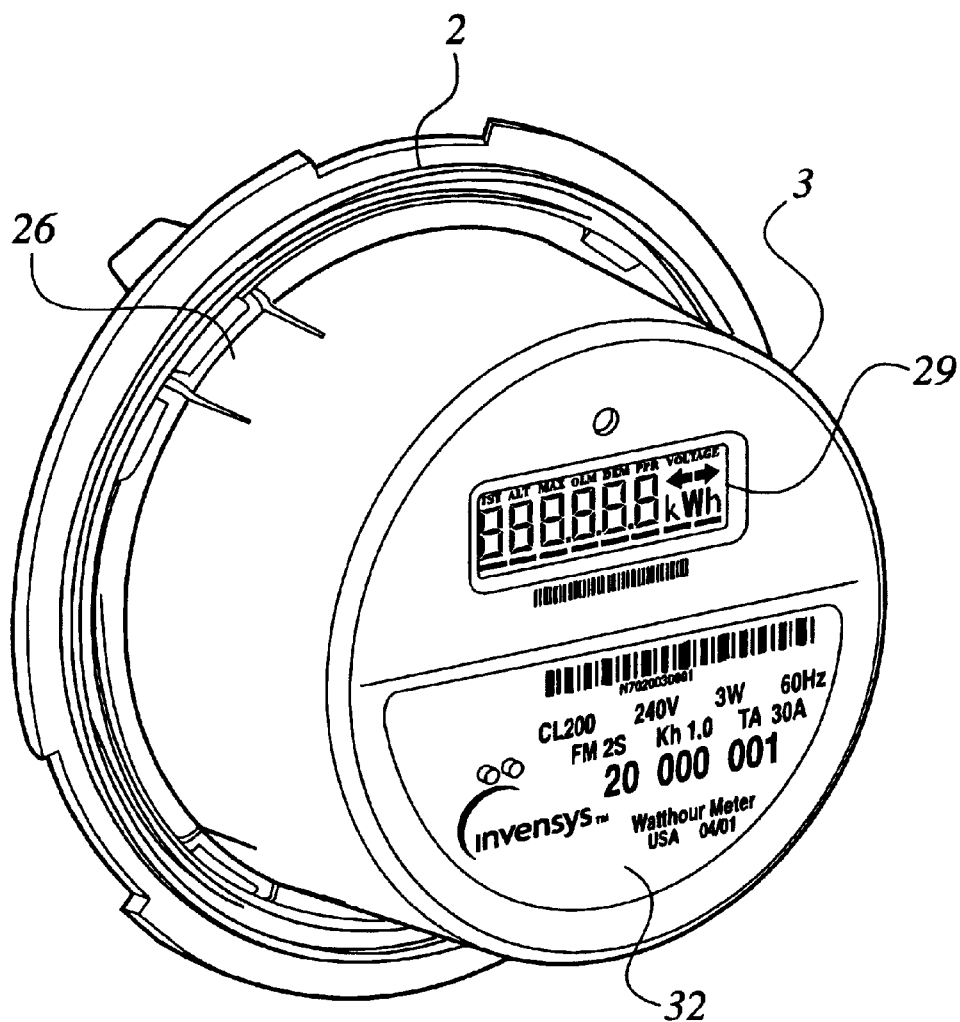
FIG. 13 shows electricity meter assembly with the meter cover removed.

The register cover 3 is shown in FIG. 12 as a plastic part configured to snap onto the meter base 2, thereby covering the meter electronics. Snap release tabs 26, shown in FIGS. 12 and 13, engage with meter cover lock notches 15 indicated in FIG. 5. Snap release tabs 26 of register cover 3 do not provide 100% of the retention to meter base 2. Instead, when meter cover 1 is twist-locked to the meter base 2, register cover locks 43 on the meter cover 1 (see FIG. 14), engage in three places with register cover 3 secure ramps 42 to fully secure the register cover 3 to meter base 2. The number of snap release tabs 26, register cover locks 43, and register cover secure ramps 42 may be varied in accord with the invention, with a plurality of such components symmetrically disposed about a center axis of the meter being preferred. The geometry of the secure ramps 42 may also be varied. In a preferred aspect, the secure ramps 42 uniformly define a ramped portion along a clockwise or counterclockwise side thereof and a land portion. The land portion may be flat, substantially flat, or curvilinear. It is preferred that any substantially flat or curvilinear geometry includes a sloped section sloping in an opposite direction of the ramp so as to provide a positive rotation lock or stop.

Along the right side lip of register cover 3 is a notch for T-bar seal pocket 27. Because of this, register cover 3 can only be installed in one way to the meter base. PCB support locks 28 are molded into register cover 3 in four places to stabilize PCB supports 11 once register cover 3 is installed in meter base 2. A manufacturer/customer label area 31 is provided on the front of register cover 3. When register cover 3 is installed, all of the electronics are hidden with the exception of LCD 29 and infrared (IR) test pulse indicator window 30. The IR indicator may be used for general purpose reading and testing of the meter, in a manner known to those skilled in the art.

Meter cover 1, as shown in FIGS. 1, 2, 3, and 14, protects the entire meter from the elements of nature such as rain, snow, and hail. Meter cover 1 is preferably constructed of a polycarbonate (plastic) material or similar material. Along the lip of meter cover 1 are, in one aspect of the invention, three equally spaced locking tabs 34 that engage with three meter cover lock notches 15 shown in FIG. 5. Since meter cover lock notches 15 are equally spaced, any one of three rotational orientations can be accepted for installation. Alternatively, two or four or more locking tabs 34 could be employed in accord with the invention in correspondence to a similar plurality of meter cover lock notches 15. To install meter cover 1 to meter base 2, the lock notches 15 are aligned with locking tabs 34 and the meter cover twisted approximately one-eighth turn clockwise. This rotation causes the meter register cover locks 43 to engage the secure ramps 42 of meter base lock notches 15 and pulls the meter cover 1 against meter base 2. At the same time that the meter cover 1 is pulled tightly against the meter base 2, meter cover seal 40, which is retained in cover seal groove 14, is compressed for weather sealing the entire unit.

Figure 14:
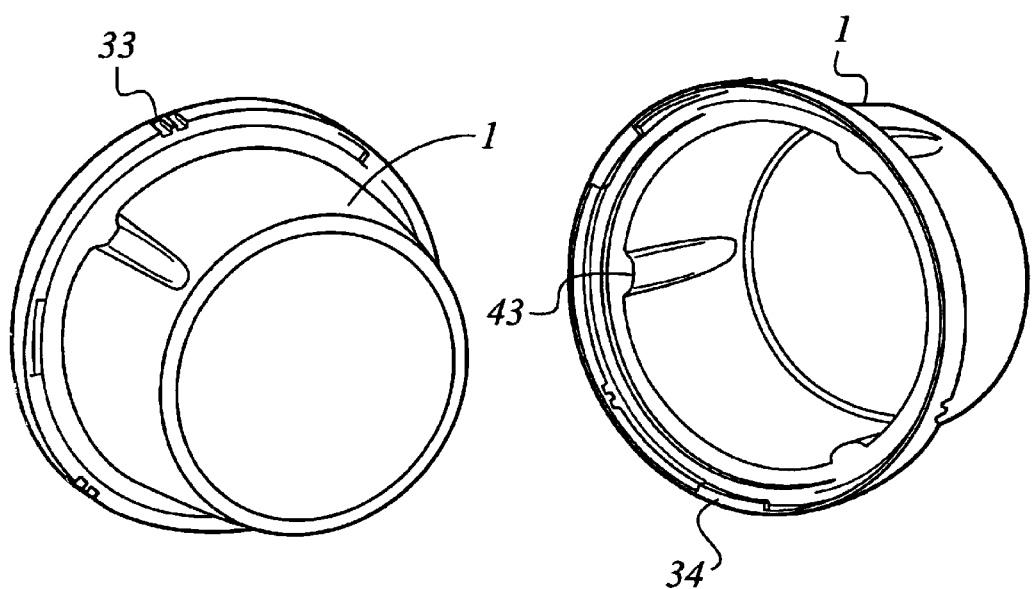
FIG. 14 shows front and rear views of the meter cover.

As shown in FIG. 14, for example, a preferred aspect of the register cover locks comprises three indentations substantially traversing a length of the meter cover 1 from a position near the front face to a bottom of cavity defined by the meter cover. In this aspect of the invention, the depth of the indentations increases along toward the bottom of the cavity defined by the meter cover. These indentations advantageously provide a gripping surface that permits a technician to easily grasp and apply a rotational torque to the meter cover to disengage the cover from the meter base.

In other aspects of the invention, the indentations could be omitted entirely or replaced by openings and/or protrusions configured to receive specialized tools so as to reduce the possibility of unauthorized access or tampering. In such configuration, the register cover lock itself could comprise an internally disposed protrusion configured to co-act with the respective secure ramps 42. Internally disposed protrusions may preferably be strengthened by longitudinal ribs extending along a lengthwise axis of meter cover 1. Further, the secure ramps 42, meter base 2, and meter cover locking tabs 34 can be individually or collectively configured to impart a desired degree of a normal force between the front side of the meter cover locking tabs 34 and the rear surface of meter base 2 so as to regulate the static and/or sliding frictional forces therebetween to provide a desired torque necessary to initiate rotational movement of the meter cover 1 in an opening direction. Such control of the opening forces can serve to deter unauthorized access, particularly in combination with other positive anti-intrusion measures such as, but not limited to, a substantially smooth meter cover 2 comprising a plurality of openings configured for insertion of an appropriately configured torque transmitting device.

Also in accord with the invention, it is also to be understood that the secure ramps 42 may be disposed on the meter base 2 itself and the aforementioned register cover locks 43 could be configured as meter cover locks to co-act with meter cover secure ramps to achieve positive compression locking of the meter cover to the meter base. In this way, the register cover 3 could be omitted and the functions thereof could be incorporated into the meter cover 1. For example, the meter cover could be endowed with a tinting to attenuate or substantially eliminate incident thermal loading on the meter and to obscure the innards of the meter from public view. Further, such tinting can be omitted in areas corresponding to an digital display (e.g., LCD) or manufacturer/customer label affixed to the inside surface of the meter cover.

Three T-bar access holes 33, as shown in FIG. 14, are equally spaced around meter cover 1. Subsequent to fully engaging and locking the meter cover to the meter base, one of the three T-bar access holes 33 in the meter cover will line up with T-bar seal slot 24 in the 3 o'clock position of the meter base. It is only at this stage of the assembly that the T-bar seal can be installed.

The above is a description of unique features and attributes of the electricity meter. It is clear that one skilled in the art could add additional features such as a key that would allow installation of meter cover 1 in only one way thereby eliminating the need for two of the three T-bar access holes 33. One skilled in the art could also vary the design of the features described using known mechanisms to accomplish what is described in this disclosure without departing from the principals that are described.

Although the present invention has been described and illustrated in detail, it is clearly understood that the same is by way of illustration and example only and is not to be taken by way of limitation, the spirit and scope of the present invention being limited by the terms of the appended claims and their equivalents.

What is claimed is:

1. A utility meter for measuring electric power consumption comprising:
    a meter base having a front surface and a back surface and comprising a plurality of supports projecting from said front surface and defining a plurality of slotted through-holes disposed adjacent said supports, each of said supports bearing a plurality of resilient locking members at predetermined locations thereof, said resilient locking members configured to engage a circumferential edge of a circuit board bearing at least one electrical device;
    a circuit board comprising a sensor for measuring a current supplied to a load;
    a bus bar comprising an upper bus bar portion and a lower bus bar portion, each of said upper bus bar portion and lower bus bar portion comprising two substantially planar blades configured for insertion at least partially through said slotted through-holes;
    a plurality of resilient bus bar locks disposed adjacent respective slotted through-holes, said resilient bus bar locks comprising an engaging portion at least partially overlapping the adjacent slotted through-hole; and
    a solid-state energy metering circuitry configured for generating power consumption signals from the sensor output,
    wherein said bus bar is configured to retain said sensor between the upper bus bar portion and lower bus bar portion, and
    wherein said engaging portion of said resilient bus bar lock is configured to be displaced from an initial position to a second position by said blades upon insertion of the blades into said slotted through-holes and to return to said initial position following complete insertion of said blade into said through-hole to engage a top surface of said blades and thereby impede withdrawal of said blades from said slotted through-hole.

2. A utility meter for measuring electric power consumption according to claim 1, wherein said meter base further comprises bus bar guides extending outwardly from an upper face of the meter base and disposed adjacent said slotted through-holes.

3. A utility meter for measuring electric power consumption according to claim 2, wherein said meter base further comprises a register cover lock tab.

4. A utility meter for measuring electric power consumption according to claim 3, wherein said bus bar guides are provided adjacent said resilient bus bar locks.

5. A utility meter for measuring electric power consumption according to claim 4, wherein said resilient bus bar lock engaging portion comprises a chamfered upper surface and a substantially planar lower surface.

6. A utility meter for measuring electric power consumption according to claim 5, further comprising a plurality of phantom load conductor sockets defining through-holes in said meter base, said phantom load conductor sockets including a boss on a front surface of said meter base, said boss defining a polygonal opening.

7. A utility meter for measuring electric power consumption according to claim 6, further comprising a plurality of phantom load conductors electrically connected at one end, to phantom load circuit traces on the circuit board bearing said sensor and electrically connectable via an electrical connection means, at another end, to a phantom load link disposed on a back side of said meter base, at least a portion of said phantom load conductors comprising a polygonal portion corresponding in shape and location to said polygonal opening, so as to prevent rotation of said phantom load conductors relative to said phantom load conductor sockets.

8. A utility meter for measuring electric power consumption according to claim 7, said electrical connection means comprises a screw inserted into a corresponding one of said phantom load conductor sockets from the back side of said meter base to contact a corresponding phantom load conductor.

9. A utility meter for measuring electric power consumption according to claim 7, wherein said circuit board defines through-holes in positions corresponding to a location of said phantom load conductors.

10. A utility meter for measuring electric power consumption as in claim 7, wherein the base further comprises a meter hanger for attaching the meter to a surface and T-bar connectors for detecting unauthorized access to the meter.

11. A utility meter for measuring electric power consumption as in claim 1, further comprising a register cover having a plurality of secure ramps disposed on a base portion thereof, each of said secure ramps having a ramped portion along one side and a land portion,
    wherein said meter base further comprises a plurality of meter cover lock notches,
    wherein said meter cover further comprises a plurality of meter cover locks corresponding to said plurality of secure ramps, and a plurality of locking tabs corresponding to said plurality of meter cover lock notches, and
    wherein upon insertion of the meter cover locking tabs into the meter base lock notches and rotation of the meter cover in one of a predetermined clockwise or counterclockwise direction, the meter cover locks engage the corresponding secure ramps, thereby biasing the meter cover locking tabs against the backside of the meter base to provide a secure connection.

12. A utility meter for measuring electric power consumption as in claim 11, further comprising a circuit board bearing at least one electrical device between said plurality of supports by a corresponding plurality of said resilient locking members.

* * * * *